(12) United States Patent
Hoekstra et al.

(10) Patent No.: US 8,487,657 B1
(45) Date of Patent: Jul. 16, 2013

(54) DYNAMIC LOGIC CIRCUIT

(75) Inventors: George P. Hoekstra, Austin, TX (US); Ravindraraj Ramaraju, Round Rock, TX (US); Maciej Bajkowski, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/484,870

(22) Filed: May 31, 2012

(51) Int. Cl.
*H03K 19/096* (2006.01)

(52) U.S. Cl.
USPC .............. 326/98; 326/112; 326/121

(58) Field of Classification Search
USPC .................. 326/93, 94–98, 112, 119, 121
See application file for complete search history.

(56) References Cited

U.S. PATENT DOCUMENTS

| | | | |
|---|---|---|---|
| 5,852,373 A * | 12/1998 | Chu et al. .................. | 326/98 |
| 6,002,292 A | 12/1999 | Allen et al. | |
| 6,496,038 B1 | 12/2002 | Sprague et al. | |
| 6,549,038 B1 | 4/2003 | Sechen et al. | |
| 6,559,680 B2 | 5/2003 | Bhushan et al. | |
| 6,791,365 B2 | 9/2004 | Bosshart | |
| 6,791,757 B2 | 9/2004 | Hobbs et al. | |
| 6,794,901 B2 * | 9/2004 | Bernstein et al. .................. | 326/95 |
| 6,914,452 B2 | 7/2005 | Gauthier et al. | |
| 6,940,314 B1 | 9/2005 | Bloker et al. | |
| 6,996,686 B2 | 2/2006 | Doblar et al. | |
| 7,109,757 B2 | 9/2006 | Yuan et al. | |
| 7,940,087 B1 | 5/2011 | Weigl | |
| 2004/0041590 A1 * | 3/2004 | Bernstein et al. .................. | 326/95 |
| 2008/0116938 A1 | 5/2008 | Ngo et al. | |
| 2008/0284469 A1 | 11/2008 | Belluomini et al. | |

OTHER PUBLICATIONS

Weste et al.; "Circuit Families"; CMOS VLSI Design—A Circuits and Systems Perspective; Mar. 1, 2010; Cover Page, Table of Contents; 4 pgs.; Addison-Wesley.
U.S. Appl. No. 11/438,890, filed May 23, 2006.
Office Action mailed Mar. 19, 2013 in U.S. Appl. No. 13/484859.

* cited by examiner

*Primary Examiner* — Don Le
(74) *Attorney, Agent, or Firm* — Joanna G. Chiu; James L. Clingan, Jr.

(57) ABSTRACT

A dynamic logic circuit includes an N channel transistor stack between a dynamic node and a first power supply terminal for receiving a plurality of logic signals. A P channel clock transistor is coupled between a second power supply terminal and the dynamic node is for receiving a clock signal. An N channel clock transistor is in series with the N channel stack and is between the dynamic node and the first power supply terminal is for receiving the clock signal. A keeper transistor has a first current electrode coupled to the dynamic node, a second current electrode coupled to a second power supply terminal, and a control electrode. A static logic circuit has an output for providing an output responsive to a state of the logic signals. The output is coupled to the control electrode of the keeper transistor.

20 Claims, 3 Drawing Sheets

DYNAMIC LOGIC CIRCUIT

CROSS-REFERENCE TO RELATED APPLICATION(S)

This application is related to U.S. patent application Ser. No. 13/484,859, filed on even date, entitled "Dynamic Logic Circuit," naming Ravindraraj Ramaraju and George Hoekstra as inventors, and assigned to the current assignee hereof.

BACKGROUND

1. Field

This disclosure relates generally to dynamic logic circuits, and more specifically, to dynamic logic circuits with a keeper transistor.

2. Related Art

Dynamic logic circuits are typically used in applications requiring high speed operation. Dynamic logic circuits operate in accordance with a clock signal, in which, during a precharge phase of a clock cycle, the dynamic node of the dynamic logic circuit is precharged to a logic level high, and during a subsequent evaluate phase of the clock cycle, the dynamic logic circuit evaluates the logic inputs. As a result of the evaluation, the dynamic node may maintain the logic level high or be pulled down to a logic level low. A PMOS keeper circuit connected to the dynamic node of the dynamic logic circuit may be used to ensure that the dynamic node is never left floating. For example, during the evaluate phase of the clock, the keeper circuit ensures that the dynamic node does not float by feeding back an output signal of the dynamic logic circuit. However, if, during the evaluate phase of the clock, the inputs of the dynamic logic circuit cause the state of the dynamic node to be pulled low, the keeper circuit must be overcome in order to provide the correct output.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, a dynamic logic circuit includes a P channel keeper transistor and a static logic circuit that is coupled to a gate of the P channel keeper transistor. The static logic circuit, based on the values of logic input signals, controls enabling and disabling of the P channel keeper transistor during the evaluate phase of the clock signal. For example, if the logic input signals to the dynamic logic circuit, during an evaluate phase, do not result in changing the precharged state of a dynamic node of the dynamic logic circuit, the P channel keeper transistor ensures that the dynamic node remains at the precharged state and does not become floating. However, if the logic input signals during the evaluate phase result in changing the precharged state of the dynamic node, the P channel keeper transistor is disabled such that no current is provided to the dynamic node by the P channel keeper transistor. In this manner, the changing of the precharged state of the dynamic node may occur without having to overcome the P channel keeper transistor. In one embodiment, as will be described below, the disabling of the P channel keeper transistor is performed by using a static logic circuit which receives the input logic signals and provides a keeper signal to the gate of the P channel keeper transistor to enable/disable the keeper transistor. Therefore, by selectively disabling the P channel keeper transistor dependent upon the values of the input signals, increased speed may be achieved.

Figure 1:
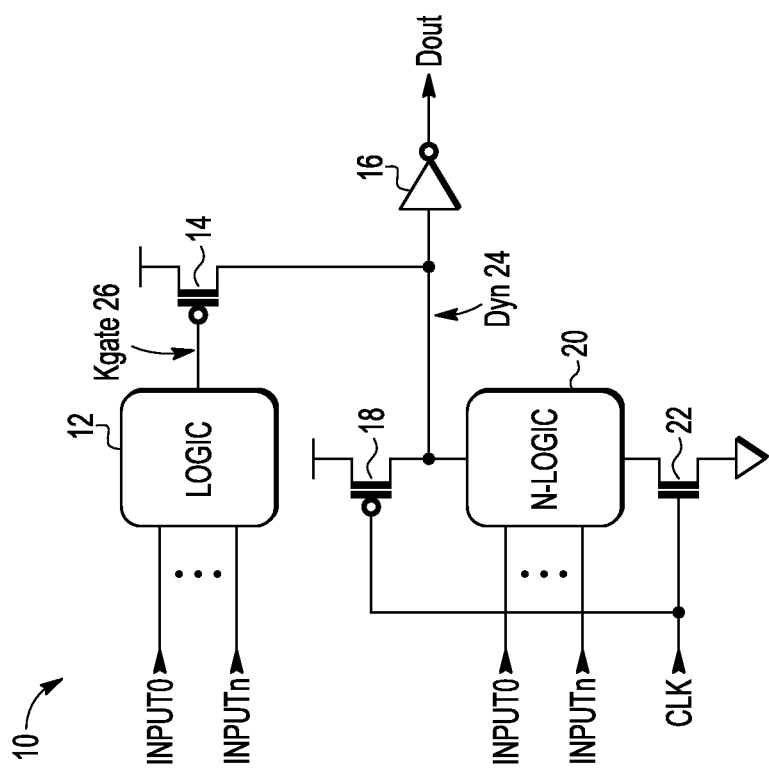
FIG. 1 illustrates, in partial schematic and partial block diagram form, a dynamic logic circuit in accordance with an embodiment of the disclosure.

FIG. 1 illustrates, in partial schematic and partial block diagram form, a dynamic logic circuit 10 in accordance with an embodiment of the present disclosure. Dynamic logic circuit 10 includes P channel transistors 14 and 18, inverter 16, N channel transistor 22, logic 12, and N-logic 20. P channel transistor 18 has a first current electrode connected to a positive power supply terminal, e.g. Vdd, and a gate connected to receive a clock signal, CLK. A second current electrode of transistor 18 is connected to a dynamic node (DYN) 24. N-logic 20 is connected between DYN 24 and a first current electrode of N channel transistor 22, and a second current electrode of N channel transistor 22 is connected to a negative power supply terminal, e.g. ground. (As used herein, a negative power supply terminal is a power supply terminal that is intended to be at a lower potential than the positive power supply terminal.) A gate of transistor 22 is connected to CLK. Logic 12 is connected to a gate of P channel transistor 16. A first current electrode of transistor 14 is connected to Vdd and a second current electrode of transistor 14 is connected to DYN 24. An input of inverter 16 is connected to DYN 24, and an output of inverter 16 provides an output, DOUT, of dynamic logic circuit 10. N-logic 20 receives n inputs, Input0-Inputn. Logic 12 also receives Input0-Inputn. The value n can represent any integer greater than or equal to 2.

In operation, during a precharge phase of CLK, in which CLK is a logic level low, transistor 18 is on and transistor 22 is off. Therefore, DYN 24 is precharged to a logic level high by transistor 18. Inverter 16 outputs DOUT as a logic level low. Therefore, DOUT is precharged to a logic level low during the precharge phase. During the subsequent evaluate phase of CLK, in which CLK is a logic level high, the values of Input0-Inputn are evaluated by N-logic 20 which may result in DYN 24 staying at a logic level high or being pulled to a logic level low. That is, the value of DYN 24 (and thus DOUT) is based on the logic implemented by N-logic 20. In one embodiment, N-logic 20 includes one or more N channel transistor stacks, in which each N channel transistor stack includes a plurality of N channel transistors connected in series between DYN 24 and transistor 22, in which each transistor of the plurality of N channel transistors has a corresponding input of Input0-Inputn connected to its gate. Each stack of N channel transistors may be referred to as a NAND stack in which, during an evaluate phase of CLK, DYN 24 is pulled low by a NAND stack only when all inputs to the gates of the NAND stack are a logic level high. Logic 12 may include static logic circuitry which also receives Input0-Inputn (and may also receive the complements of these signals, denoted with a "b" following the names, such as Input0b-Inputnb). During the evaluate phase of CLK, when all inputs to the gates of a NAND stack are a logic level high, logic 12 operates to turn off (i.e. disable) transistor 14 such that DYN 24 can be pulled to a logic level low without having to overcome transistor 14. However, if during the evaluate phase none of the NAND stacks pull DYN 24 low, logic 12 allows transistor 16 to remain on (i.e. enabled) so as to ensure that DYN 24 is coupled to Vdd and does not float (since transistor 18 is off during the evaluate phase of CLK). Note that transistor 14 may be referred to as a keeper transistor or a P channel keeper transistor.

Figure 2:
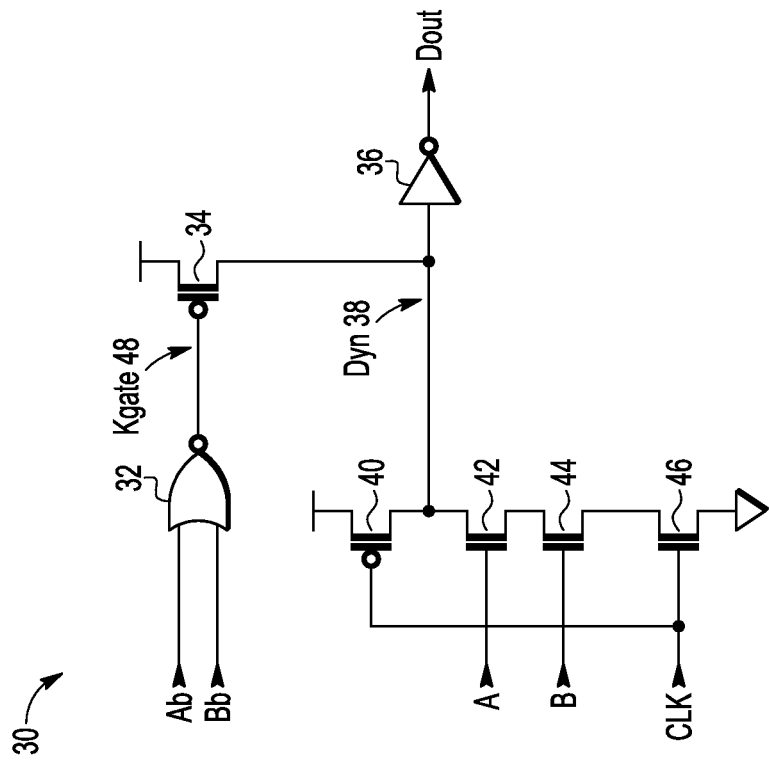
FIG. 2 illustrates, in schematic form, an exemplary implementation of the dynamic logic circuit of FIG. 1.

FIG. 2 illustrates a dynamic logic circuit 30 which provides an exemplary implementation of dynamic logic circuit 10 in which dynamic logic circuit 30 implements a dynamic AND function ("A AND B"). Dynamic logic circuit 30 includes P channel transistors 34 and 40, N channel transistors 42, 44, and 46, NOR gate 32, and inverter 36. A first current electrode (e.g. source) of P channel transistor 34 is connected to a positive power supply terminal (e.g. Vdd), a gate of transistor 34 is connected to an output of NOR gate 32, and a second current electrode (e.g. drain) of transistor 34 is connected to dynamic circuit node (DYN) 38. The circuit node at the gate of transistor 34 (and at the output of NOR gate 32) may be referred to as keeper gate circuit node (KGATE) 48. An input of inverter 36 is connected to DYN 38, and an output of inverter 36 provides an output, DOUT, of dynamic logic circuit 30. A first current electrode (e.g. source) of P channel transistor 40 is connected to Vdd, a second current electrode (e.g. drain) of P channel transistor 40 is connected to DYN 38, and a gate of P channel transistor 40 is connected to CLK. N channel transistor 42 has a first current electrode (e.g. drain) connected to DYN 38, and a gate connected to a first input logic signal, A. N channel transistor 44 has a first current electrode (e.g. drain) connected to a second current electrode (e.g. source) of transistor 42, and a gate connected to a second input logic signal, B. N channel transistor 46 has a first current electrode (e.g. drain) connected to a second current electrode (e.g. source) of transistor 44, a gate connected to CLK, and a second current electrode (e.g. source) connected to a negative power supply terminal (e.g. ground). A first input of NOR gate 32 is connected to receive the complement of input signal A, Ab, and the second input of NOR gate 32 is connected to receive the complement of input signal B, Bb.

Note that transistors 34, 40, and 46 are analogous to transistors 14, 18, and 22 of FIG. 1, and that transistor 34 may also be referred to as a keeper transistor or P channel keeper transistor. Transistors 42 and 44 are an exemplary implementation of N-logic 20, in which transistors 42 and 44 form an N channel transistor stack or a NAND stack. NOR gate 32 is an exemplary implementation of logic 12. Note that if inverters are needed to provide the complements of the input signals A and B, these inverters may be included as part of logic 12, or may be included in the circuitry which provides the input signals A and B to the dynamic logic circuit. Dynamic logic circuit 30 implements a dynamic AND gate such that DOUT, during the evaluate phase of CLK, provides the result of the logical AND of A and B.

In operation, during a precharge phase of CLK, in which CLK is a logic level low, transistor 40 is on and transistor 46 is off. Therefore, DYN 38 is precharged to a logic level high by transistor 40. Inverter 36 outputs DOUT as a logic level low. Therefore, DOUT is precharged to a logic level low during the precharge phase. During the subsequent evaluate phase of CLK, in which CLK is a logic level high, the values of input signals A and B are evaluated, which may result in a change of state of DYN 38. If only one of A or B are a logic level high (meaning at least one of A or B is a logic level low) or if both A and B are a logic level low, DYN 38 remains at its precharge state of a logic level high. In this case, the output of NOR gate 32 (and thus KGATE 48) is a logic level low, maintaining transistor 34 in its conductive state. This ensures that DYN 38 does not float (since transistor 40 is off during the evaluate phase). However, if both A and B are at a logic level high during the evaluate phase, DYN 38 is pulled low by the path to ground created by transistors 42, 44, and 46 all being on. In this case, since both A and B are a logic level one (and thus Ab and Bb are logic level zeros), the output of NOR gate 32 (and thus KGATE 48) is at a logic level high which turns off transistor 34. In this manner, DYN 38 can be more quickly pulled low as compared to the situation in which transistor 34 remains enabled because there is no contention between the pull down path through transistors 42, 44, and 46 and pull-up transistor 34. Therefore, in the illustrated embodiment, keeper transistor 34 is selectively turned on by NOR gate 32 based on the values of A and B. That is, the enabling and disabling of the keeper transistor is controlled based on the actual values of the input logic signals.

In one embodiment, transistors 40 and 46, which receive CLK, may be referred to as a clock circuit which enables an output of the transistors 42 and 44 to be coupled to DYN 38 when CLK is an evaluate phase (since transistor 46 is on and transistor 40 is off during this phase) and to decouple the output of the transistors 42 and 44 from DYN 38 when CLK is in a precharge phase (since transistor 46 is off and transistor 40 is on).

In one embodiment, NOR gate 32 (or logic 12) may be referred to as a keeper control circuit coupled to the keeper transistor, such as transistor 34, which asserts a keeper signal to the gate of the keeper transistor responsive to logic signals (e.g. A and B) to retain the precharged state on DYN 38 when the logic signals indicate that DYN 38 is to be in the precharged state (such as when both A and B are not a logic level one) and to deassert the keeper signal from the gate of the keeper transistor for the case when DYN 38 switches from the precharged state to a different state (such as when both A and B are a logic level one). If the keeper signal is asserted, then keeper transistor 34 is enabled (i.e. turned on such that it is conductive); however, when the keeper signal is deasserted, keeper transistor 34 is disabled (i.e. turned off such that it is non-conductive). Therefore, note that DYN 38 is held in the precharge state by enabling keeper transistor 34 during the evaluate phase of the CLK unless a first combination of A and B is received during the evaluate phase. For example, if the combination of both A and B is one is received, DYN 38 is not held at the precharge state by keeper transistor 34 since transistor 34 is disabled by NOR gate 32 (which is responsive to A and B). In this manner, DYN 38 is allowed to change states. However, if this combination is not received, then DYN 38 is held in the precharge state by keeper transistor 34 which is enabled by NOR gate 32.

Figure 3:
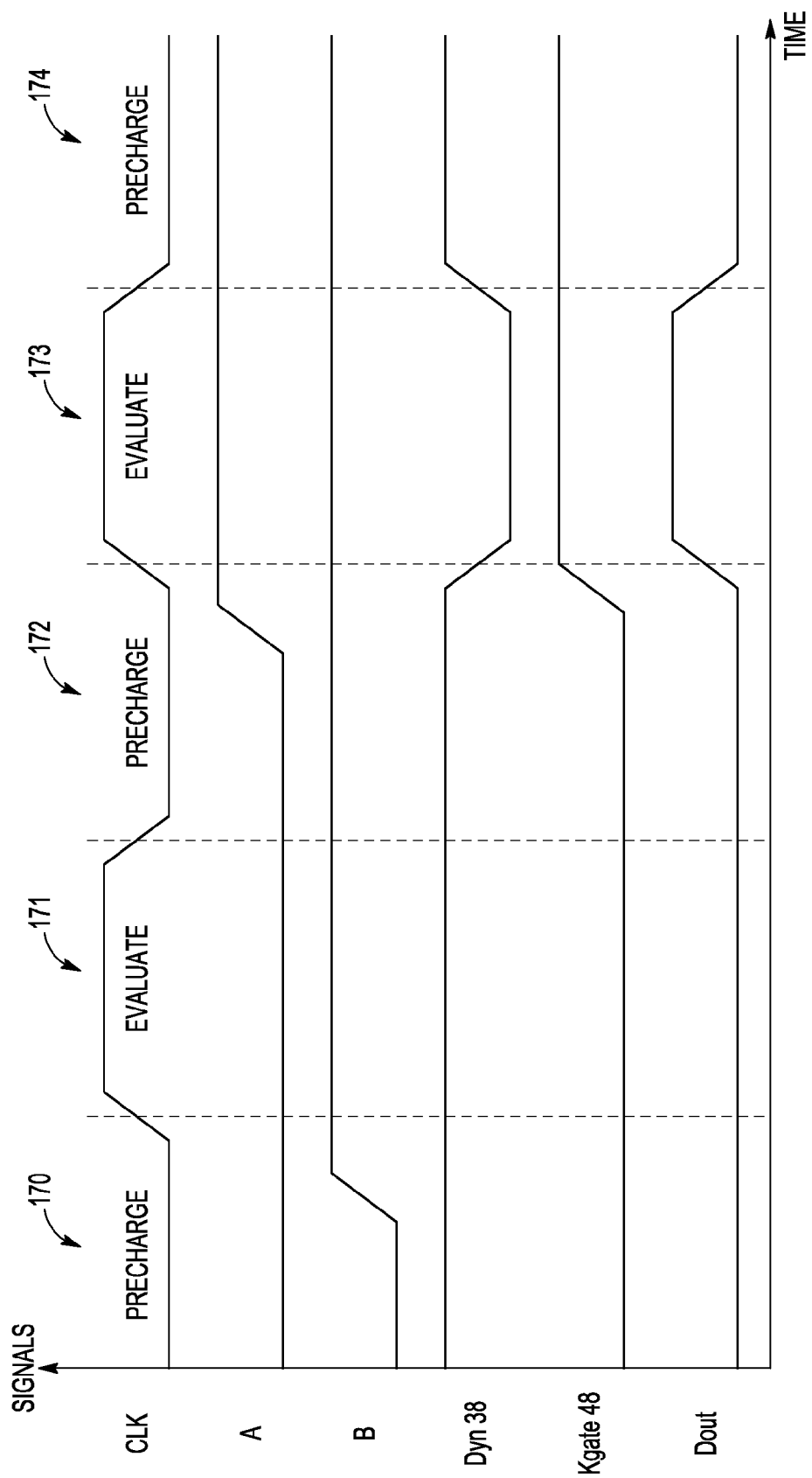
FIG. 3 illustrates a plurality of waveforms corresponding to various signals of the dynamic logic circuit of FIG. 2.

FIG. 3 illustrates example waveforms for various signals or nodes of dynamic logic circuit 30. During a first precharge phase 170 of CLK, DYN 38 is precharged to a logic level high and DOUT is therefore precharged to a logic level low. The value of A is a logic level zero, and the value of B, at some point in time prior to a subsequent evaluate phase 171 of CLK, is a logic level one. Note that B transitions from a logic level zero to a logic level one with a sufficient amount of time prior to the rising edge of CLK. That is, a sufficient setup time must be provided between a valid value of input signal A and B and the rising edge of CLK. Also, during precharge phase 170, KGATE 48 also remains at a logic level low which keeps transistor 34 on. During evaluate phase 171, since A is a logic level 0, DYN 38 remains a logic level high and DOUT remains a logic level low. Also, since A is a logic level 0, Ab is a logic level 1, and KGATE 48 at the output of NOR gate 32 remains a logic level zero, thus maintaining transistor 34 on which maintains DYN 38 at a logic level high.

During a second precharge phase 172 of CLK, DYN 38 is again precharged to a logic level high, and DOUT to a logic level low. Input logic signal A, at some point in time during precharge phase 172 and prior to a subsequent evaluate phase 173, switches to a logic level one. Therefore, during evaluate phase 173, since both A and B are at logic level ones, transistors 42 and 44 are both on. In this manner, since CLK is a logic level one as well, a pull-down path is created by transistors 42, 44, and 46. Also, KGATE 48 at the output of NOR gate 32 is a logic level one, thus disabling keeper transistor 34. DYN 38 is therefore pulled to a logic level low and DOUT switches to a logic level one. Note that since keeper transistor 34 is disabled during the evaluate phase, DYN 38 can be pulled down by transistors 42, 44, and 46 without needing to overcome transistor 34. During a third precharge phase 174 of CLK, DYN 38 is again precharged to a logic level high in preparation for a subsequent evaluate phase.

In an alternate embodiment, dynamic logic circuit 30 may include one or more additional inputs, such as C, which can be provided to the gate of an additional N channel transistor connected in series with transistors 42 and 44 and NOR gate 32 may include an additional input to receive the complement of C, Cb. In this example, the evaluation of DOUT would correspond to the logical AND of inputs A, B, and C.

Note that in the implementation of FIG. 2, each of input signals A and B are additionally loaded by NOR gate 32. However, even taking into consideration the additional capacitance which may be introduced by NOR gate 32, the selective disabling of the keeper transistor during the evaluate phase based on the actual values of A and B may result in improved speed by removing contention with the keeper transistor. Therefore, note that keeper control logic, such as logic 12, may include static logic which operates to selectively disable keeper transistor during the evaluate phase based on the values of the input logic signals (in which the input logic signals are those signals which determine the value of DOUT).

Figure 4:
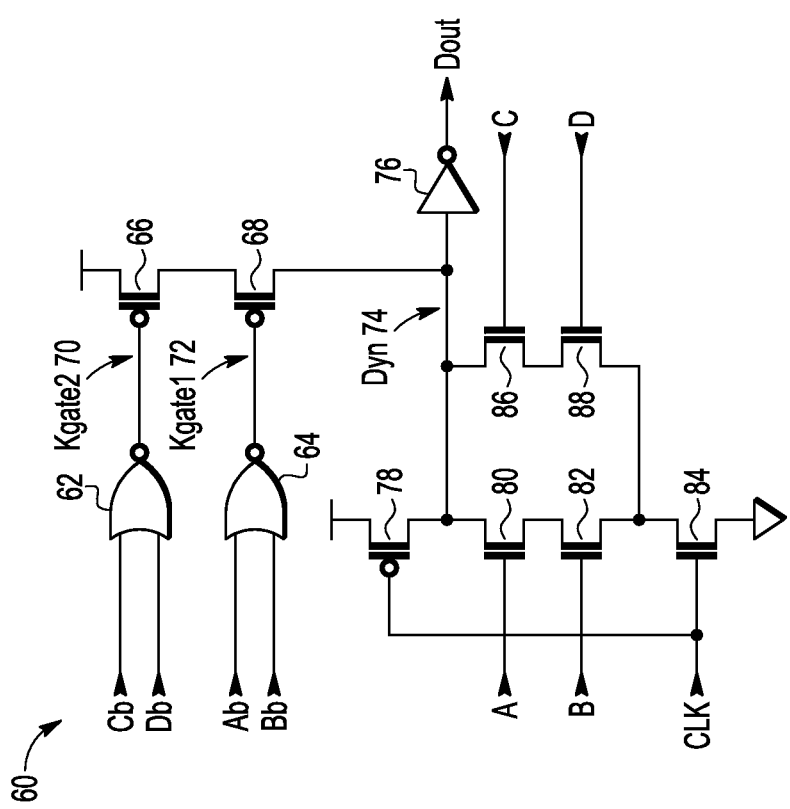
FIG. 4 illustrates, in schematic form, an exemplary implementation of the dynamic logic circuit of FIG. 1.

FIG. 4 illustrates a dynamic logic circuit 60 which provides another exemplary implementation of dynamic logic circuit 10 in which dynamic logic circuit 30 implements a dynamic logic function representative of "(A AND B) OR (C AND D)". Dynamic logic circuit 60 includes P channel transistors 66, 68, and 78, N channel transistors 80, 82, 84, 86, and 88, NOR gates 62 and 64, and inverter 76. A first current electrode (e.g. source) of P channel transistor 66 is connected to a power supply terminal, Vdd, a gate of transistor 66 is connected to an output of NOR gate 62. A first current electrode (e.g. source) of P channel transistor 68 is connected to a second current electrode (e.g. drain) of transistor 66, a gate of transistor 68 is connected to an output of NOR gate 64, and a second current electrode (e.g. drain) of transistor 68 is connected to a dynamic circuit node (DYN) 74. The circuit node at the gate of transistor 68 (and at the output of NOR gate 64) may be referred to as keeper gate 1 circuit node (KGATE1) 72. The circuit node at the gate of transistor 66 (and at the output of NOR gate 62) may be referred to as keeper gate 2 circuit node (KGATE2) 70. A first input of inverter 76 is connected to DYN 74, and an output of inverter 76 provides an output, DOUT, of dynamic logic circuit 60. A first current electrode (e.g. source) of P channel transistor 78 is connected to Vdd, a second current electrode (e.g. drain) of P channel transistor 78 is connected to DYN 74, and a gate of P channel transistor 78 is connected to CLK. N channel transistor 80 has a first current electrode (e.g. drain) connected to DYN 74, and a gate connected to a first input logic signal, A. N channel transistor 82 has a first current electrode (e.g. drain) connected to a second current electrode (e.g. source) of transistor 80, and a gate connected to a second input logic signal, B. N channel transistor 86 has a first current electrode (e.g. drain) connected to DYN 74, and a gate connected to a third input logic signal, C. N channel transistor 88 has a first current electrode (e.g. drain) connected to a second current electrode (e.g. source) of transistor 86, and a gate connected to a fourth input logic signal, D. N channel transistor 84 has a first current electrode (e.g. drain) connected to a second current electrode (e.g. source) of transistor 82 and a second current electrode (e.g. source) or transistor 88, a gate connected to CLK, and a second current electrode (e.g. source) connected to ground. A first input of NOR gate 64 is connected to receive the complement of input signal A, Ab, and a second input of NOR gate 64 is connected to receive the complement of input signal B, Bb. A first input of NOR gate 62 is connected to receive the complement of input signal C, Cb, and a second input of NOR gate 62 is connected to receive the complement of input signal D, Db.

Note that transistors 78 and 84 are analogous to transistors 18, and 22 of FIG. 1, and that transistors 66 and 68 may also be referred to as keeper transistors or P channel keeper transistors. Transistors 80, 82, 86, and 88 are an exemplary implementation of N-logic 20, in which transistors 80 and 82 form a first N channel transistor stack, and transistors 86 and 88 form a second N channel transistor stack. NOR gates 64 and 62 is an exemplary implementation of logic 12. Note that if inverters are needed to provide the complements of the input signals A, B, C, and D, these inverters may be included as part of logic 12, or may be included in the circuitry which provides the input signals A, B, C, and D to the dynamic logic circuit. Dynamic logic circuit 60 provides the result of "(A AND B) OR (C AND D)" as DOUT during the evaluate phase of CLK.

In operation, during a precharge phase of CLK, in which CLK is a logic level low, transistor 78 is on and transistor 84 is off. Therefore, DYN 74 is precharged to a logic level high by transistor 78. Inverter 76 outputs DOUT as a logic level low. Therefore, DOUT is precharged to a logic level low during the precharge phase. During the subsequent evaluate phase of CLK, in which CLK is a logic level high, the values of input signals A, B, C, and D are evaluated, which may result in a change of state of DYN 74. If neither A and B are both high nor C and D are both high, DYN 74 remains at its precharge state of a logic level high because no pulldown path exists between DYN 74 and transistor 84. In this case, the output of NOR gate 64 (and thus KGATE1 72) is a logic level low, maintaining transistor 68 in its conductive state, and the output of NOR gate 62 (and thus KGATE2 70) is a logic level low, maintaining transistor 66 in its conductive state. This ensures that DYN 74 does not float (since transistor 78 is off during the evaluate phase). However, if, during the evaluate phase, both A and B are at a logic level high or C and D are at a logic level high, DYN 74 is pulled low by the path to ground created by transistors 80, 82, and 84 all being on or transistors 86, 88, and 84 being all on. In either case, at least one of KGATE1 72 or KGATE2 72 will be at a logic level high. (If A and B are both high, then KGATE1 72 is a logic level high, and if C and D are both high, then KGATE2 70 is a logic level high.) If KGATE1 72 is high, then transistor 68 is disabled, and if KGATE2 70 is high, then transistor 66 is disabled. Therefore, so long as one of KGATE1 72 or KGATE2 72 is high, then Vdd is decoupled from DYN 74. In this manner, DYN 74 can be more quickly pulled low as compared to the situation in which transistors 66 and 68 remain enabled because there is no contention between the pull down path from DYN 74 through transistor 84 and pull-up transistors 68 and 66. Therefore, in the illustrated embodiment, keeper transistors 66 and 68 are selectively turned on by NOR gates 62 and 64, respectively, based on the values of A and B or C and D, respectively. That is, the enabling and disabling of the keeper transistors is controlled based on the actual values of the input logic signals.

In one embodiment, NOR gates 62 and 64 (or logic 12) may be referred to as a keeper control circuit coupled to the keeper transistors, such as transistors 66 and 68, which asserts keeper signals to the gates of the keeper transistor responsive to logic signals to retain the precharged state on DYN 74 when the logic signals indicate that DYN 74 is to be in the precharged state and to deassert at least one of the keeper signals from the gates of the keeper transistors for the case when DYN 74 switches from the precharged state to a different state (such as when both A and B are a logic level one or when both C and D are a logic level one). If a keeper signal is asserted, then the corresponding keeper transistor is enabled (i.e. turned on such that it is conductive); however, when the keeper signal is deasserted, the corresponding keeper transistor is disabled (i.e. turned off such that it is non-conductive). Therefore, note that DYN 74 is held in the precharge state by enabling keeper transistors 68 and 66 during the evaluate phase of the CLK unless particular combinations of A, B, C, and D are received during the evaluate phase. For example, if the combination of both A and B is one is received or the combination of both C and D is one is received, DYN 74 is not held at the precharge state by keeper transistors 66 and 68 since at least one of the keeper transistors will be disabled by a corresponding NOR gate (the one whose inputs are both logic level zeros). In this manner, DYN 74 is allowed to change states. However, if these particular combinations are not received, then DYN 74 is held in the precharge state by keeper transistors 66 and 68 which are enabled by NOR gates 62 and 64, respectively.

Therefore, by now it can be appreciated how a keeper control circuit may be used to control a gate of one or more keeper transistors of a dynamic logic circuit so as to selectively disable the keeper transistor during the evaluate phase based on the values of the logic input signals. In this manner, when a pull down path is created during the evaluate phase to change the state of the dynamic node of the dynamic logic circuit, the keeper control circuit disables the keeper transistor to allow for a faster switch of states. However, when a pull down path is not created during the evaluate phase, the keeper circuit maintains the keeper transistors in their conductive states so as to prevent the dynamic node from floating.

As used herein, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Although the invention is described herein with reference to specific embodiments, various modifications and changes can be made without departing from the scope of the present invention as set forth in the claims below. For example, dynamic logic circuit 10 may implement a variety of different logic functions other than a dynamic AND. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a dynamic logic circuit, including a first N channel transistor stack between a dynamic node and a first power supply terminal for receiving a plurality of logic signals; a P channel clock transistor coupled between a second power supply terminal and the dynamic node for receiving a clock signal; an N channel clock transistor in series with the first N channel stack and between the dynamic node and the first power supply terminal for receiving the clock signal; a keeper transistor having a first current electrode coupled to the dynamic node, a second current electrode coupled to a second power supply terminal, and a control electrode; and a static logic circuit having an output for providing an output responsive to a state of the logic signals, wherein the output is coupled to the control electrode of the keeper transistor. Item 2 includes the dynamic logic circuit of item 1, wherein the first N channel transistor stack includes a first N channel transistor having a drain coupled to the dynamic node, a gate for receiving a first logic signal of the plurality of logic signals, and a source; and a second N channel transistor having a drain connected to the source of the first N channel transistor, a gate for receiving a second logic signal, and a source coupled to the N channel clock transistor. Item 3 includes the dynamic logic circuit of item 2, wherein the N channel clock transistor has a drain coupled to the source of the second N channel transistor, a gate for receiving the clock signal, and source coupled to the first power supply terminal and wherein the P channel clock transistor has a source connected to the second power supply terminal, a gate for receiving the clock signal, and a drain connected to the dynamic node. Item 4 includes the dynamic logic circuit of item 2, wherein the static logic circuit has inputs for receiving complements of the logic signals. Item 5 includes the dynamic logic circuit of item 4, wherein the first N channel transistor stack further includes a third N channel transistor coupled in series with the first and second N channel transistors, wherein the third N channel transistor is for receiving a third logic signal. Item 6 includes the dynamic logic circuit of item 5, wherein the static logic circuit is a NOR gate. Item 7 includes the dynamic logic circuit of item 1, and further includes a second N channel transistor stack in parallel with the first N channel transistor stack and for receiving a second plurality of logic signals; a second keeper transistor, wherein the keeper transistor and the second keeper transistor are in series between the dynamic node and the second power supply terminal; and a second static logic circuit having an output for providing an output responsive to a state of the second logic signals, wherein the output of the second static logic circuit is coupled to a control electrode of the second keeper transistor. Item 8 includes the dynamic logic circuit of item 1, wherein the keeper transistor is a P-type transistor. Item 9 includes the dynamic logic circuit of item 1, wherein the keeper transistor is directly connected to the dynamic node. Item 10 includes the dynamic logic circuit of item 1, wherein the keeper transistor is for keeping the dynamic node from floating during an evaluation period of the clock signal for a first logic condition of the dynamic node and for being non-conductive during the evaluation period of the clock signal for a second logic condition of the dynamic node.

Item 11 includes a dynamic logic circuit for providing an output representative of a combination of logic signals, including a first plurality of transistors for receiving the logic signals; a clock circuit for enabling an output of the first plurality of transistors to be coupled to a dynamic node when a clock signal is in an evaluation phase and to decouple the output of the first plurality of transistors from the dynamic node when the clock signal is in a precharge phase; a first keeper transistor having a first current electrode coupled to the dynamic node, a second current electrode coupled to a positive power supply terminal, and a control electrode; and a keeper control circuit coupled to the first keeper transistor for asserting a keeper signal to the control electrode of the first keeper transistor responsive to a state of the logic signals to retain a first logic state on the dynamic node when the logic signals indicate that the dynamic node is to be in the first logic state and for deasserting the keeper signal from the first keeper transistor for the case of the dynamic node switching from the first logic state to a second logic state. Item 12 includes the dynamic logic circuit of item 11, wherein the first plurality of transistors are in series between the dynamic node and a negative power supply terminal. Item 13 includes the dynamic logic circuit of item 12, wherein the first plurality of transistors include N channel transistors, and wherein each transistor of the first plurality of transistors receives a unique one of the logic signals. Item 14 includes the dynamic logic circuit of item 13, wherein the keeper control circuit has a plurality of inputs for receiving complements of the logic signals received by the first plurality of transistors. Item 15 includes the dynamic logic circuit of item 14, wherein each input of the plurality of inputs has a corresponding transistor in the first plurality of transistors and receives the complement of the logic signal received by the corresponding transistor. Item 16 includes the dynamic logic circuit of item 15, wherein the first keeper transistor is a P channel transistor, wherein the second current electrode of the first keeper transistor is a source of the first keeper transistor, and wherein the clock circuit includes an N channel transistor coupled in series with the first plurality of transistors and has a gate for receiving the clock signal. Item 17 includes the dynamic logic circuit of item 16, and further includes a second plurality of transistors, in parallel with the first plurality of transistors, for receiving a second plurality of logic signals; a second keeper transistor in series with the first keeper transistor; and a second keeper control circuit having an output coupled to a control electrode of the second keeper transistor and inputs for receiving complements of the second logic signals.

Item 18 includes a method of operating a dynamic circuit, including precharging a dynamic node during a precharge phase of a clock to a first logic state; holding the dynamic node in the first logic state by enabling a keeper transistor coupled to the dynamic node during an evaluation phase of the clock unless a first combination of logic signals is received during the evaluation phase; and if the first combination of logic signals is received during the evaluation phase: disabling the keeper transistor responsive to a state of the logic signals, and switching the dynamic node to a second logic state. Item 19 includes the method of item 18, wherein the enabling the keeper transistor is further characterized by coupling a positive power supply terminal to the dynamic node through the keeper transistor. Item 20 includes the method of item 19, wherein the disabling the keeper transistor includes causing the keeper transistor to decouple the positive power supply terminal from the dynamic node.

What is claimed is:

1. A dynamic logic circuit, comprising:
 a first N channel transistor stack between a dynamic node and a first power supply terminal for receiving a plurality of logic signals;
 a P channel clock transistor coupled between a second power supply terminal and the dynamic node for receiving a clock signal;
 an N channel clock transistor in series with the first N channel stack and between the dynamic node and the first power supply terminal for receiving the clock signal;
 a keeper transistor having a first current electrode coupled to the dynamic node, a second current electrode coupled to a second power supply terminal, and a control electrode; and
 a static logic circuit having an output for providing an output responsive to a state of the logic signals, wherein the output is coupled to the control electrode of the keeper transistor.

2. The dynamic logic circuit of claim 1, wherein the first N channel transistor stack comprises:
 a first N channel transistor having a drain coupled to the dynamic node, a gate for receiving a first logic signal of the plurality of logic signals, and a source; and
 a second N channel transistor having a drain connected to the source of the first N channel transistor, a gate for receiving a second logic signal, and a source coupled to the N channel clock transistor.

3. The dynamic logic circuit of claim 2, wherein the N channel clock transistor has a drain coupled to the source of the second N channel transistor, a gate for receiving the clock signal, and source coupled to the first power supply terminal and wherein the P channel clock transistor has a source connected to the second power supply terminal, a gate for receiving the clock signal, and a drain connected to the dynamic node.

4. The dynamic logic circuit of claim 2, wherein the static logic circuit has inputs for receiving complements of the logic signals.

5. The dynamic logic circuit of claim 4, wherein the first N channel transistor stack further comprises a third N channel transistor coupled in series with the first and second N channel transistors, wherein the third N channel transistor is for receiving a third logic signal.

6. The dynamic logic circuit of claim 5, wherein the static logic circuit is a NOR gate.

7. The dynamic logic circuit of claim 1, further comprising:
a second N channel transistor stack in parallel with the first N channel transistor stack and for receiving a second plurality of logic signals;
a second keeper transistor, wherein the keeper transistor and the second keeper transistor are in series between the dynamic node and the second power supply terminal; and
a second static logic circuit having an output for providing an output responsive to a state of the second logic signals, wherein the output of the second static logic circuit is coupled to a control electrode of the second keeper transistor.

8. The dynamic logic circuit of claim 1, wherein the keeper transistor is a P-type transistor.

9. The dynamic logic circuit of claim 1, wherein the keeper transistor is directly connected to the dynamic node.

10. The dynamic logic circuit of claim 1 wherein the keeper transistor is for keeping the dynamic node from floating during an evaluation period of the clock signal for a first logic condition of the dynamic node and for being non-conductive during the evaluation period of the clock signal for a second logic condition of the dynamic node.

11. A dynamic logic circuit for providing an output representative of a combination of logic signals, comprising:
a first plurality of transistors for receiving the logic signals;
a clock circuit for enabling an output of the first plurality of transistors to be coupled to a dynamic node when a clock signal is in an evaluation phase and to decouple the output of the first plurality of transistors from the dynamic node when the clock signal is in a precharge phase;
a first keeper transistor having a first current electrode coupled to the dynamic node, a second current electrode coupled to a positive power supply terminal, and a control electrode; and
a keeper control circuit coupled to the first keeper transistor for asserting a keeper signal to the control electrode of the first keeper transistor responsive to a state of the logic signals to retain a first logic state on the dynamic node when the logic signals indicate that the dynamic node is to be in the first logic state and for deasserting the keeper signal from the first keeper transistor for the case of the dynamic node switching from the first logic state to a second logic state.

12. The dynamic logic circuit of claim 11, wherein the first plurality of transistors are in series between the dynamic node and a negative power supply terminal.

13. The dynamic logic circuit of claim 12, wherein the first plurality of transistors comprise N channel transistors, and wherein each transistor of the first plurality of transistors receives a unique one of the logic signals.

14. The dynamic logic circuit of claim 13, wherein the keeper control circuit has a plurality of inputs for receiving complements of the logic signals received by the first plurality of transistors.

15. The dynamic logic circuit of claim 14, wherein each input of the plurality of inputs has a corresponding transistor in the first plurality of transistors and receives the complement of the logic signal received by the corresponding transistor.

16. The dynamic logic circuit of claim 15, wherein the first keeper transistor is a P channel transistor, wherein the second current electrode of the first keeper transistor is a source of the first keeper transistor, and wherein the clock circuit comprises an N channel transistor coupled in series with the first plurality of transistors and has a gate for receiving the clock signal.

17. The dynamic logic circuit of claim 16, further comprising:
a second plurality of transistors, in parallel with the first plurality of transistors, for receiving a second plurality of logic signals;
a second keeper transistor in series with the first keeper transistor; and
a second keeper control circuit having an output coupled to a control electrode of the second keeper transistor and inputs for receiving complements of the second logic signals.

18. A method of operating a dynamic circuit, comprising:
precharging a dynamic node during a precharge phase of a clock to a first logic state;
holding the dynamic node in the first logic state by enabling a keeper transistor coupled to the dynamic node during an evaluation phase of the clock unless a first combination of logic signals is received during the evaluation phase; and
if the first combination of logic signals is received during the evaluation phase:
disabling the keeper transistor responsive to a state of the logic signals, and
switching the dynamic node to a second logic state.

19. The method of claim 18, wherein the enabling the keeper transistor is further characterized by coupling a positive power supply terminal to the dynamic node through the keeper transistor.

20. The method of claim 19, wherein the disabling the keeper transistor includes causing the keeper transistor to decouple the positive power supply terminal from the dynamic node.

* * * * *